United States Patent
Chang et al.

(10) Patent No.: US 10,637,454 B2
(45) Date of Patent: Apr. 28, 2020

(54) PULSE-WIDTH MODULATION CONTROLLER AND TRI-STATE VOLTAGE GENERATION METHOD

(71) Applicant: uPI semiconductor corp., Zhubei, Hsinchu County (TW)

(72) Inventors: Chih-Lien Chang, Zhubei (TW); Min-Rui Lai, Zhubei (TW)

(73) Assignee: UPI SEMICONDUCTOR CORP., Zhubei, Hsinchu County (TW)

( * ) Notice: Subject to any disclaimer, the term of this patent is extended or adjusted under 35 U.S.C. 154(b) by 0 days.

(21) Appl. No.: 16/296,545

(22) Filed: Mar. 8, 2019

(65) Prior Publication Data
US 2019/0288675 A1  Sep. 19, 2019

(30) Foreign Application Priority Data
Mar. 16, 2018 (TW) .............................. 107109148 A

(51) Int. Cl.
*H03K 19/00* (2006.01)
*H03K 7/08* (2006.01)

(52) U.S. Cl.
CPC .......... *H03K 7/08* (2013.01); *H03K 19/0002* (2013.01)

(58) Field of Classification Search
CPC ..... H03K 7/08; H03K 19/0002; H02M 3/156; H02M 2001/0048
See application file for complete search history.

(56) References Cited

U.S. PATENT DOCUMENTS 8,638,080 B2  1/2014  Agrawal et al.
2013/0271101 A1*  10/2013  Nanov ................. H03K 17/162
                                                          323/282

* cited by examiner

*Primary Examiner* — Jung Kim
(74) *Attorney, Agent, or Firm* — McClure, Qualey & Rodack, LLP

(57) ABSTRACT

A pulse-width modulation (PWM) controller including an output pin, a temporary voltage generation circuit and a tri-state voltage generation circuit is disclosed. The temporary voltage generation circuit includes a voltage-dividing unit and a control unit. The voltage-dividing unit is coupled to the output pin and the control unit respectively. The control unit receives an enable signal and a PWM signal. The tri-state voltage generation circuit is coupled to the temporary voltage generation circuit and the output pin and receives the enable signal, the PWM signal and a tri-state input voltage. When the PWM controller is operated in a tri-state mode, the control unit controls the voltage-dividing unit to provide a temporary voltage to the output pin according to the enable signal and PWM signal, and then the tri-state voltage generation circuit provides a tri-state voltage to the output pin according to the enable signal and PWM signal.

7 Claims, 5 Drawing Sheets

PULSE-WIDTH MODULATION CONTROLLER AND TRI-STATE VOLTAGE GENERATION METHOD

BACKGROUND OF THE INVENTION

1. Field of the Invention

The invention relates to a power supply circuit; in particular, to a pulse-width modulation (PWM) controller and a tri-state voltage generation method.

2. Description of the Prior Art

In the operation of the conventional power supply circuit, in order to reduce the switching energy loss, there is a period in which the upper switch and the lower switch are turned off during the zero current (ZC) state. At this time, the pulse-width modulation signal will have a voltage level between high-level and low-level, which is called a tri-state.

Please refer to FIG. 1. FIG. 1 illustrates a schematic diagram of a conventional PWM controller 1. As shown in FIG. 1, in the normal operating state, the PWM signal generator 10 turns on or turns off the operation switch PMOS through the PWM signal PWMB, thereby generating an output signal Q and transmitting the output signal Q to an external driving circuit 12 through a PWM output pin PIN 1.

However, the output of the buffer BF in FIG. 1 is affected by the resistance-capacitance effect generated by the parasitic capacitor CPS in the driving circuit 12 and the external setting resistor RSET. Therefore, as shown in FIG. 2, the voltage level of the conventional PWM output signal Q should take a period of time (for example, 180 ns) to be pulled to a fixed tri-state voltage level, resulting in poor switching performance.

SUMMARY OF THE INVENTION

Therefore, the invention provides a pulse-width modulation (PWM) controller and a tri-state voltage generation method to effectively solve the above-mentioned problems in the prior art.

An embodiment of the invention is a PWM controller. In this embodiment, the PWM controller includes an output pin, a temporary voltage generation circuit and a tri-state voltage generation circuit. The temporary voltage generation circuit includes a voltage-dividing unit and a control unit. The voltage-dividing unit is coupled to the output pin and the control unit respectively, wherein the control unit receives an enable signal and a PWM signal. The tri-state voltage generation circuit is coupled to the temporary voltage generation circuit and the output pin and used for receiving the enable signal, the PWM signal and a tri-state input voltage. When the PWM controller is operated in a tri-state mode, the control unit controls the voltage-dividing unit to provide a temporary voltage to the output pin according to the enable signal and the PWM signal, and then the tri-state voltage generation circuit provides a tri-state voltage to the output pin according to the enable signal and the PWM signal.

In an embodiment of the invention, the voltage-dividing unit includes a first output node, a first operation switch, a second operation switch, a first resistor and a second resistor. The first operation switch is coupled to the first resistor and the second operation switch is coupled to the second resistor. The first output node is located between the first resistor and the second resistor and coupled to the output pin.

In an embodiment of the invention, the control unit includes a first switch and a pulse generator, and the pulse generator controls the voltage-dividing unit to generate the temporary voltage according to the enable signal and the PWM signal.

In an embodiment of the invention, when the PWM controller receives the enable signal, the PWM controller is controlled by the enable signal to selectively operate in the tri-state mode or a normal mode.

In an embodiment of the invention, the tri-state voltage generation circuit includes a second switch, a logic unit and a buffer unit; the second switch is coupled to the logic unit, the buffer unit and the output pin respectively; the logic unit receives the enable signal and the PWM signal, and an input terminal of the buffer unit receives the tri-state input voltage.

In an embodiment of the invention, the temporary voltage generator includes a pulse generator, the pulse generator is triggered by a back porch of the PWM signal to generate a pulse to control the temporary voltage to continue for a default time.

In an embodiment of the invention, the tri-state voltage generation circuit includes a third operation switch, a fourth operation switch and a third switch; the third operation switch is coupled to the fourth operation switch, and a second output node between the third operation switch and the fourth operation switch is coupled to the output pin; the third switch is coupled to the fourth operation switch and a ground terminal respectively; the fourth operation switch receives the enable signal and the PWM signal respectively.

Another embodiment of the invention is a tri-state voltage generation method. In this embodiment, the tri-state voltage generation method is applied to a pulse-width modulation (PWM) controller including an output pin, a temporary voltage generation circuit and a tri-state voltage generation circuit. The temporary voltage generation circuit includes a voltage-dividing unit and a control unit. The voltage-dividing unit is coupled to the output pin and the control unit respectively. The control unit receives an enable signal and a PWM signal. The tri-state voltage generation circuit is coupled to the temporary voltage generation circuit and the output pin and receives the enable signal, the PWM signal and a tri-state input voltage. The tri-state voltage generation method includes steps of: (a) operating the PWM controller in a tri-state mode; (b) providing a temporary voltage to the output pin according to the enable signal and the PWM signal; and (c) providing a tri-state voltage to the output pin according to the enable signal and the PWM signal.

In an embodiment of the invention, the step (c) further includes: stopping providing the temporary voltage.

In an embodiment of the invention, the step (b) further includes: generating a pulse to control the temporary voltage to continue for a default time; and the output pin outputting the temporary voltage during the default time.

Compared to the prior art, when the PWM signal enters a tri-state, the PWM controller of the invention firstly uses a resistor voltage-dividing method to rapidly pull the voltage level of the PWM signal to a tri-state voltage level interval, and then maintains the voltage level of the PWM signal in the tri-state voltage level interval through a buffer. Therefore, the PWM controller of the invention can greatly shorten the time taken for the PWM signal to enter the tri-state.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
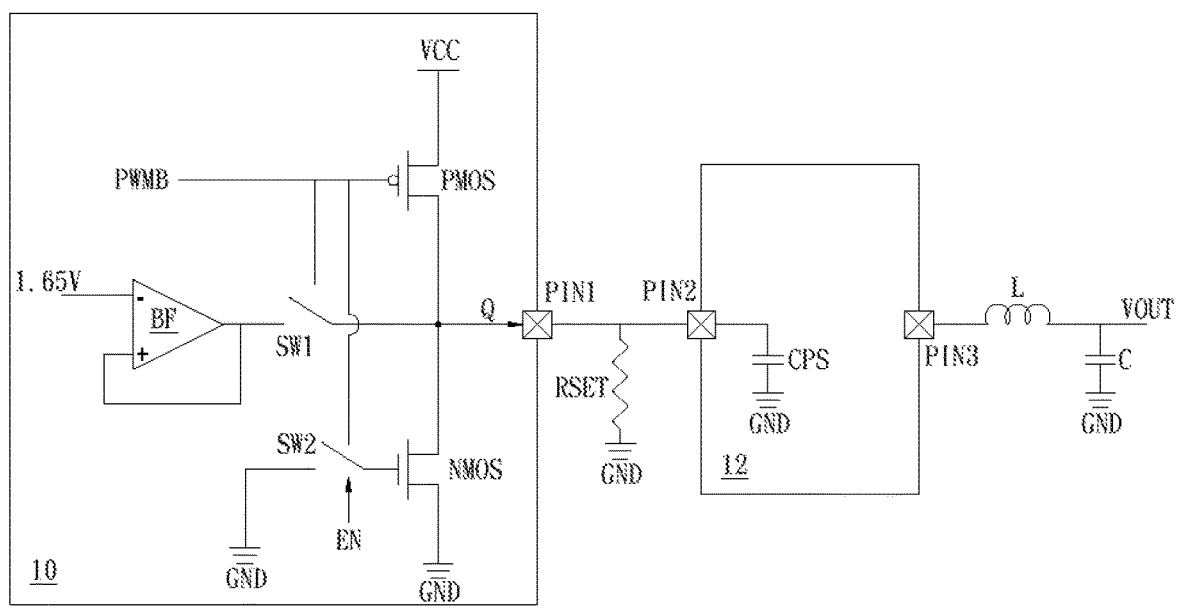
FIG. 1 illustrates a schematic diagram of the conventional PWM controller.
Figure 2:
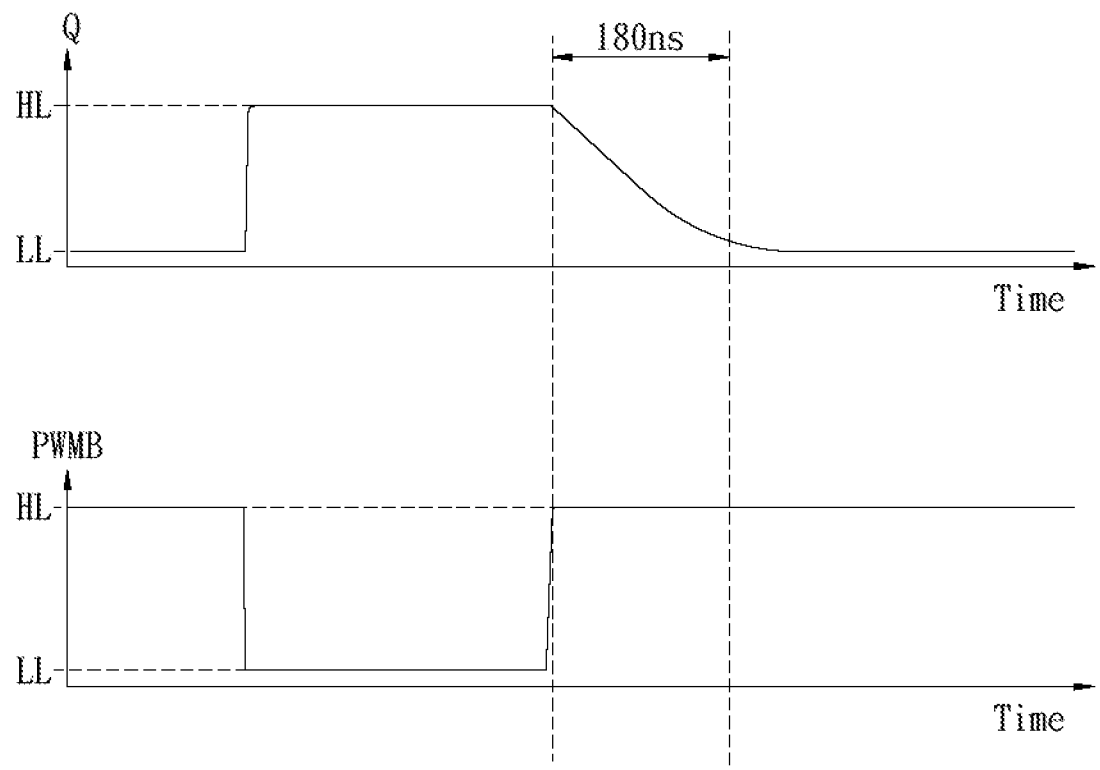
FIG. 2 illustrates timing diagrams of the output signal and the PWM signal in FIG. 1.

Exemplary embodiments of the invention are referenced in detail now, and examples of the exemplary embodiments are illustrated in the drawings. Further, the same or similar reference numerals of the elements/components in the drawings and the detailed description of the invention are used on behalf of the same or similar parts.

An embodiment of the invention is a PWM controller. In this embodiment, the PWM controller applied to a power supply circuit firstly uses the resistor voltage-dividing method to rapidly pull a voltage level of a PWM entering a tri-state to a tri-state voltage level interval, and then maintains the voltage level voltage of the PWM signal in the tri-state voltage level interval through a buffer, thereby effectively shortening the time taken for the PWM signal to enter the tri-state, and reducing the influence of a large current generated by the resistor voltage-dividing method during the PWM signal conversion on the rear coupled driving circuit.

Figure 3:
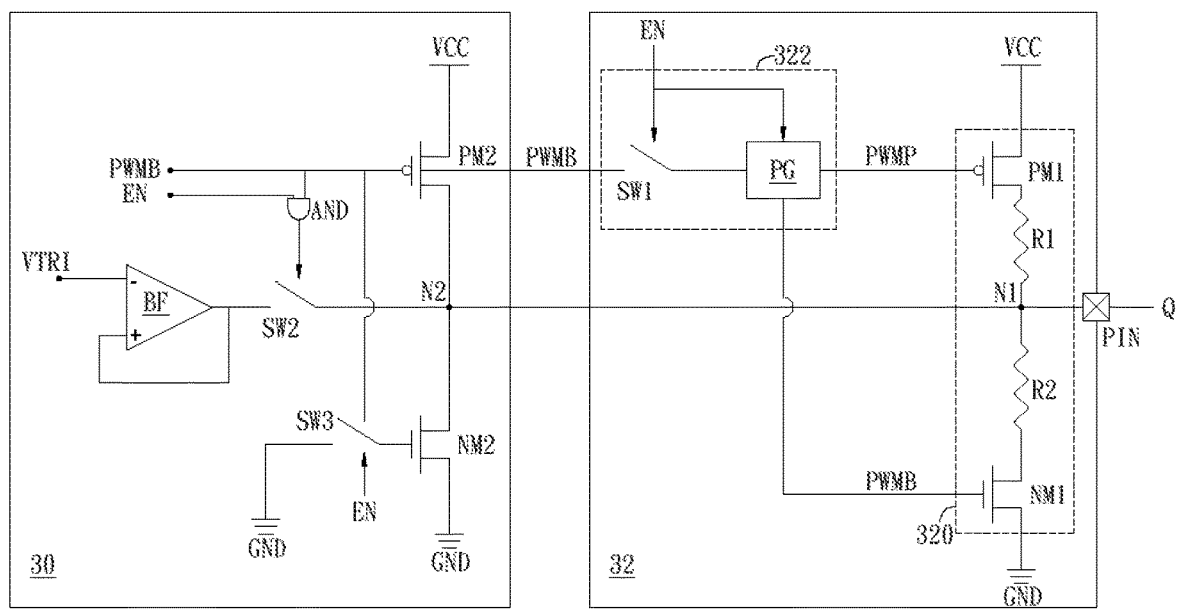
FIG. 3 illustrates a schematic diagram of the PWM controller in an embodiment of the invention.

Please refer to FIG. 3. FIG. 3 illustrates a schematic diagram of a PWM controller in this embodiment. As shown in FIG. 3, the PWM controller 3 includes an output pin PIN, a tri-state voltage generation circuit 30 and a temporary voltage generation circuit 32. The tri-state voltage generation circuit 30 and the temporary voltage generation circuit 32 are both coupled to the output pin PIN.

In practical applications, the output pin PIN is coupled to a driving circuit (not shown), such as a driver or a driver MOS integrated by a driver and a MOSFET, but not limited to this.

The tri-state voltage generation circuit 30 is coupled to the temporary voltage generation circuit 32 and the output pin PIN, and the tri-state voltage generation circuit 30 receives an enable signal EN, a PWM signal PWMB and a tri-state input voltage VTRI respectively. It should be noted that the enable signal EN and the PWM signal PWMB are externally provided, but not limited to this.

The tri-state voltage generation circuit 30 includes a second switch SW2, a logic unit AND, a buffer unit BF, a third operation switch PM2, a fourth operation switch NM2, a third switch SW3 and a second output node N2.

The third operation switch PM2 and the fourth operation switch NM2 are coupled in series between a power supply voltage VCC and a ground terminal GND. The second output node N2 is located between the third operation switch PM2 and the fourth operation switch NM2, and the second output node N2 is coupled to the output pin PIN. The second switch SW2 is coupled between the buffer unit BF and the second output node N2. An input terminal−of the buffer unit BF receives a tri-state input voltage VTRI and another input terminal+and an output terminal of the buffer unit BF are coupled. The logic unit AND is coupled to a gate of the third operation switch PM2 and the second switch SW2 respectively, and the logic unit AND receives the PWM signal PWMB and the enable signal EN respectively and outputs the PWM signal PWMB or the enable signal EN to the second switch SW2. The third switch SW3 controlled by the enable signal EN is coupled to a gate of the fourth operation switch NM2 for selectively coupling the gate of the fourth operation switch NM2 to the ground terminal GND or coupling the gate of the fourth operation switch NM2 to the PWM signal PWMB according to the enable signal EN.

The temporary voltage generation circuit 32 includes a voltage-dividing unit 320 and a control unit 322. The voltage-dividing unit 320 is coupled to the tri-state voltage generation circuit 30, the control unit 322 and the output pin PIN respectively. The control unit 322 is coupled to the tri-state voltage generation circuit 30 and the voltage-dividing unit 320 respectively, and the control unit 322 receives the enable signal EN and the PWM signal PWMB respectively.

The voltage-dividing unit 320 includes a first output node N1, a first operation switch PM1, a second operation switch NM1, a first resistor R1 and a second resistor R2. The control unit 322 includes a first switch SW1 and a pulse generator PG.

The first operation switch PM1, the first resistor R1, the second resistor R2 and the second operation switch NM1 are sequentially coupled in series between the power supply voltage VCC and the ground terminal GND. The first output node N1 is coupled between the first resistor R1 and the second resistor R2, and the first output node N1 is also coupled between the second output node N2 and the output pin PIN. The first operation switch PM1 is coupled between the power supply voltage VCC and the first resistor R1 and the gate of the first operation switch PM1 is coupled to the pulse generator PG. The second operation switch NM1 is coupled between the second resistor R2 and the ground terminal GND, and the gate of the second operation switch NM1 is also coupled to the pulse generator PG. The first switch SW1 is coupled between the tri-state voltage generation circuit 30 and the pulse generator PG. The first switch SW1 receives the PWM signal PWMB and the first switch SW1 is controlled by the enable signal EN. The pulse generator PG is coupled to the first switch SW1, the gate of the first operation switch PM1 and the gate of the second operation switch NM1 respectively.

When the PWM controller 3 receives the enable signal EN supplied externally, the PWM controller 3 is controlled by the enable signal EN to selectively operate in the normal mode or the tri-state mode. That is to say, the PWM controller 3 controls the activation or deactivation of the tri-state function according to the enable signal EN provided externally. The enable signal EN can be a continuous-conduction mode (CCM) and a discontinuous-conduction mode (DCM) switching signal, but not limited to this.

Figure 4:
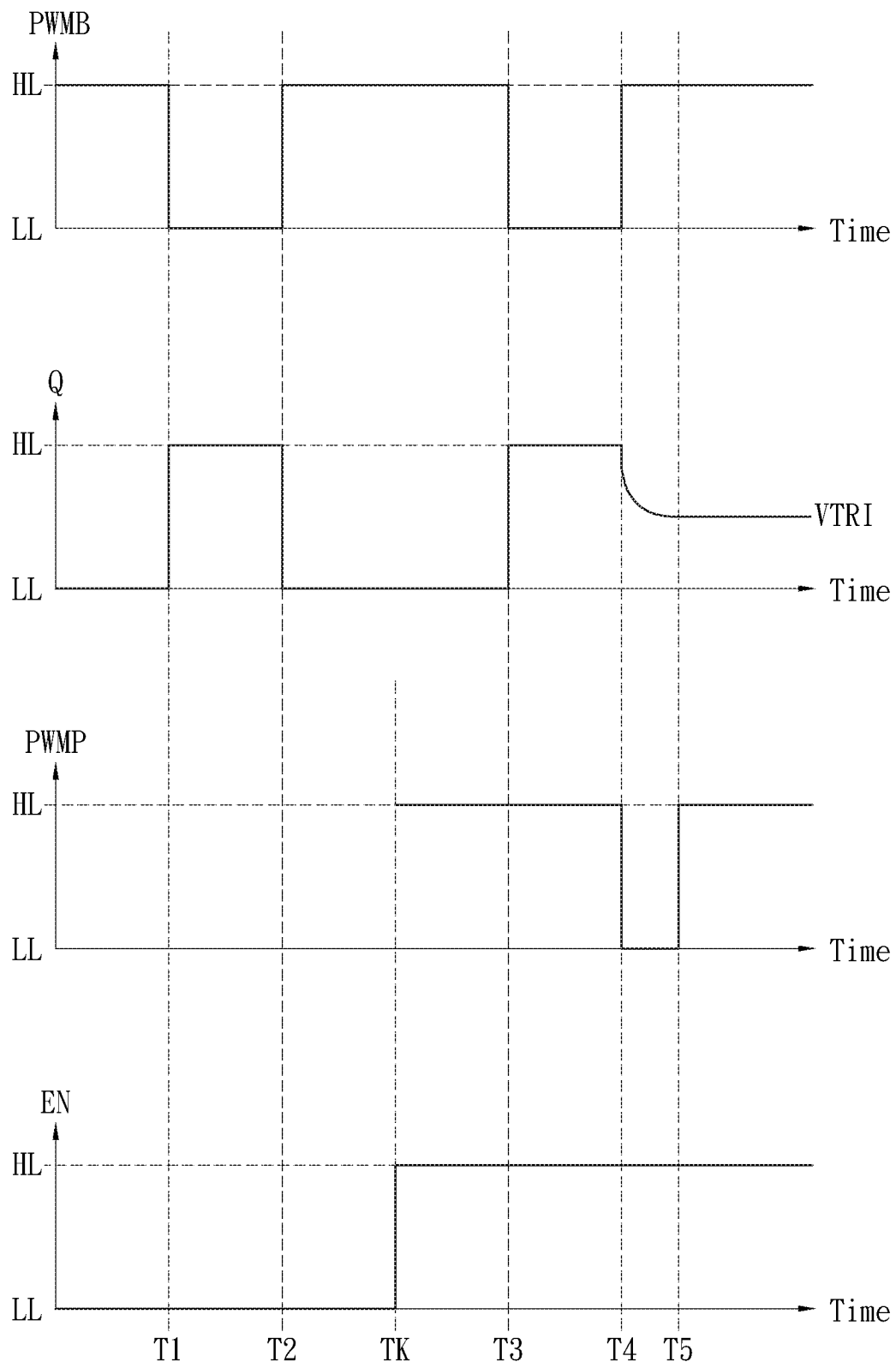
FIG. 4 illustrates timing diagrams of the PWM signal, the output signal, the pulse and the enable signal in FIG. 3.

For example, as shown in FIG. 4, when the enable signal EN has low-voltage level LL, namely before the time TK, the PWM controller 3 operates in the normal mode; at the time TK, the operation mode of the PWM controller 3 is switched from the original normal mode to the tri-state mode. When the enable signal EN has high-voltage level HL, namely after the time TK, the PWM controller 3 is controlled by the enable signal EN to operate in the tri-state mode.

When the PWM controller 3 operates in the normal mode, the enable signal EN has low-voltage level LL, and the first switch SW1 and the second switch SW2 are turned off to isolate the buffer unit BF and disable the pulse generator PG, and the third switch SW3 turns on the gate of the fourth operation switch NM2 and the PWM signal PWMB.

At the time T1, the enable signal EN has low-voltage level LL and the pulse width modulation signal PWMB transitions from high voltage level HL to low voltage level LL. At this time, the third operation switch PM2 is turned on and the fourth operation switch NM2 is turned off, so that the voltage level of the first output node N1 is high-voltage level HL, and the output signal Q outputted by the output pin PIN is converted from original low-voltage level LL to high-voltage level HL; that is to say, the output signal Q will be equal to the power supply voltage VCC.

During the period from the time T1 to the time T2, the enable signal EN is maintained at low-voltage level LL and the PWM signal PWMB is maintained at low-voltage level LL, so that the output signal Q outputted by the output pin PIN is also maintained at high-voltage level HL.

At the time T2, the enable signal EN is still maintained at low-voltage level LL, but the PWM signal PWMB is changed from low-voltage level LL to high-voltage level HL. At this time, the third operation switch PM2 is turned off and the fourth operation switch NM2 is turned on, so that the voltage level of the first output node N1 is low-voltage level LL, and the output signal Q outputted by the output pin PIN is changed from high-voltage level HL to low-voltage level LL; that is to say, the output signal Q will be equal to a ground voltage of the ground terminal GND.

During the period from the time T2 to the time TK, the enable signal EN is maintained at low-voltage level LL and the PWM signal PWMB is maintained at high-voltage level HL, so that the output signal Q outputted by the output pin PIN is also maintained at low-voltage level LL.

At the time TK, the enable signal EN is changed from original low-voltage level LL to high-voltage level HL, causing the PWM controller 3 to enter the tri-state mode.

When the PWM controller 3 is operated in the tri-state mode, the control unit 322 controls the voltage-dividing unit 320 to provide a temporary voltage to the output pin PIN according to the enable signal EN and the PWM signal PWMB, and then the tri-state voltage generation circuit 30 provides a tri-state voltage to the output pin PIN according to the enable signal EN and the PWM signal PWMB.

In the tri-state mode, the enable signal EN has high-voltage level HL, the first switch SW1 and the second switch SW2 are turned on, the buffer unit BF and the pulse generator PG are enabled, and the third switch SW3 is turned on to conduct the gate of the fourth operation switch NM2 and the ground terminal GND, so that the fourth operation switch NM2 is continuously turned off.

At the time TK, the enable signal EN is converted from original low-voltage level LL to high-voltage level HL and the PWM signal PWMB is maintained at high-voltage level HL, so that the voltage level of the first output node N1 is low-voltage level LL, and the output signal Q outputted by the output pin PIN is still maintained at low-voltage level LL.

During the period from the time TK to the time T3, the enable signal EN is still maintained at high-voltage level HL and the PWM signal PWMB is maintained at high-voltage level HL, so that the voltage level of the first output node N1 is maintained at low-voltage level LL, and the output signal Q outputted by the output pin PIN is still maintained at low-voltage level LL.

At the time T3, the enable signal EN is still maintained at high-voltage level HL, but the PWM signal PWMB is changed from high-voltage level HL to low-voltage level LL. At this time, the third operation switch PM2 is turned on and the second operation switch NM1 and the fourth operation switch NM2 are turned off, so that the voltage level of the first output node N1 is changed from low-voltage level LL to high-voltage level HL, and the output signal Q outputted by the output pin PIN is converted from low-voltage level LL to high-voltage level HL.

During the period from the time T3 to the time T4, the enable signal EN is maintained at high-voltage level HL and the PWM signal PWMB is maintained at low-voltage level LL, so that the voltage level of the first output node N1 is maintained at high-voltage level HL, and the output signal Q outputted by the output pin PIN is still maintained at high-voltage level HL.

At the time T4, the enable signal EN is still maintained at high-voltage level HL, but the PWM signal PWMB is converted from low-voltage level LL to high-voltage level HL, so that the pulse generator PG is triggered by a back porch of the PWM signal PWMB to generate a pulse PWMP (or an inverse square wave signal) having low-voltage level LL to the gate of the first operation switch PM1 to control the temporary voltage for a default period of time (e.g., the period from the time T4 to the time T5). A this time, the first operation switch PM1 and the second operation switch NM1 are both turned on, and the control unit 322 controls the voltage-dividing unit 320 to provide the temporary voltage to the first output node N1 according to the enable signal EN and the PWM signal PWMB, so that the output signal Q outputted by the output pin PIN is rapidly pulled from high-voltage level HL to a default tri-state voltage level (e.g., the tri-state input voltage VTRI) during this default period of time.

During the period from the time T4 to the time T5, even the output signal Q outputted by the output pin PIN has been pulled to the default tri-state voltage level interval, since the voltage-dividing unit 320 is coupled between the power supply voltage VCC and the ground terminal GND, the first output node N1 will still continue to use the temporary voltage as the output signal Q.

At the time T5, the enable signal EN is still maintained at high-voltage level HL and the PWM signal PWMB is still maintained at high-voltage level HL, the pulse generator PG will stop generating the pulse PWMP (or the inverse square wave signal) having low-voltage level LL, and the voltage-dividing unit 320 will stop providing the temporary voltage. Therefore, starting from the time T5, the PWM controller 3 will maintain the voltage level of the output signal Q outputted by the output pin PIN at the default tri-state voltage level interval through the buffer BF. By doing so, the time taken for the PWM signal to enter the tri-state can be greatly shortened, and the duration of the large current when the PWM signal is converted can be short, so that the rear driving circuit can be ensured without being damaged.

Another embodiment of the invention is a tri-state voltage generation method. In this embodiment, the tri-state voltage generation method is applied to a PWM controller. The PWM controller includes an output pin, a temporary voltage generation circuit and a tri-state voltage generation circuit. The temporary voltage generation circuit includes a voltage-dividing unit and a control unit. The voltage-dividing unit is coupled to the output pin and the control unit respectively. The control unit receives an enable signal and a PWM signal. The tri-state voltage generation circuit is coupled to the temporary voltage generation circuit and the output pin and receives the enable signal, the PWM signal and a tri-state input voltage. The detailed circuit structure of the PWM controller can be referred to FIG. 3 and the foregoing text, and will not be further described herein.

Figure 5:
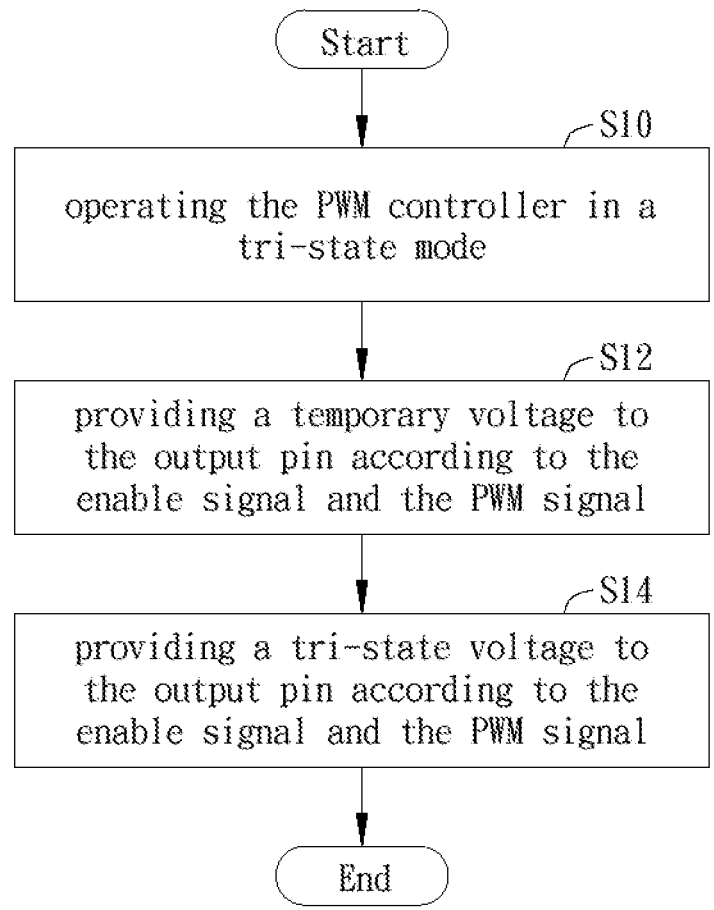
FIG. 5 illustrates a flowchart of the tri-state voltage generation method in another embodiment of the invention.

Please refer to FIG. 5. FIG. 5 illustrates a flowchart of the tri-state voltage generation method in this embodiment. As shown in FIG. 5, the tri-state voltage generation method includes steps of:

step S10: operating the PWM controller in a tri-state mode;

step S12: providing a temporary voltage to the output pin according to the enable signal and the PWM signal; and step S14: providing a tri-state voltage to the output pin according to the enable signal and the PWM signal.

In an embodiment, in the step S12, the tri-state voltage generation method can further generate a pulse to control the temporary voltage to continue for a default time; and the output pin can output the temporary voltage during the default time, but not limited to this.

In another embodiment, in the step S14, when the tri-state voltage generation method generates the tri-state voltage at the output pin, the tri-state voltage generation method can stop providing the temporary voltage at the same time, but not limited to this.

Compared to the prior art, when the PWM signal enters a tri-state, the PWM controller of the invention firstly uses a resistor voltage-dividing method to rapidly pull the voltage level of the PWM signal to a tri-state voltage level interval, and then maintains the voltage level of the PWM signal in the tri-state voltage level interval through a buffer. Therefore, the PWM controller of the invention can greatly shorten the time taken for the PWM signal to enter the tri-state.

What is claimed is:

1. A pulse-width modulation (PWM) controller, comprising:

an output pin;

a temporary voltage generation circuit comprising a voltage-dividing unit and a control unit, the voltage-dividing unit being coupled to the output pin and the control unit respectively, wherein the control unit receives an enable signal and a PWM signal; and a tri-state voltage generation circuit, coupled to the temporary voltage generation circuit and the output pin, for receiving the enable signal, the PWM signal and a tri-state input voltage, wherein when the PWM controller is operated in a tri-state mode, the control unit controls the voltage-dividing unit to provide a temporary voltage to the output pin according to the enable signal and the PWM signal, and then the tri-state voltage generation circuit provides a tri-state voltage to the output pin according to the enable signal and the PWM signal.

2. The PWM controller of claim 1, wherein the voltage-dividing unit comprises a first output node, a first operation switch, a second operation switch, a first resistor and a second resistor; the first operation switch is coupled to the first resistor and the second operation switch is coupled to the second resistor; the first output node is located between the first resistor and the second resistor and coupled to the output pin.

3. The PWM controller of claim 1, wherein the control unit comprises a first switch and a pulse generator, and the pulse generator controls the voltage-dividing unit to generate the temporary voltage according to the enable signal and the PWM signal.

4. The PWM controller of claim 3, wherein when the PWM controller receives the enable signal, the PWM controller is controlled by the enable signal to selectively operate in the tri-state mode or a normal mode.

5. The PWM controller of claim 1, wherein the tri-state voltage generation circuit comprises a second switch, a logic unit and a buffer unit; the second switch is coupled to the logic unit, the buffer unit and the output pin respectively; the logic unit receives the enable signal and the PWM signal, and an input terminal of the buffer unit receives the tri-state input voltage.

6. The PWM controller of claim 5, wherein the temporary voltage generator comprises a pulse generator, the pulse generator is triggered by a back porch of the PWM signal to generate a pulse to control the temporary voltage to continue for a default time.

7. The PWM controller of claim 1, wherein the tri-state voltage generation circuit comprises a third operation switch, a fourth operation switch and a third switch; the third operation switch is coupled to the fourth operation switch, and a second output node between the third operation switch and the fourth operation switch is coupled to the output pin; the third switch is coupled to the fourth operation switch and a ground terminal respectively; the fourth operation switch receives the enable signal and the PWM signal respectively.

* * * * *